(12) United States Patent
Upadhyayula et al.

(10) Patent No.: US 12,080,616 B2
(45) Date of Patent: Sep. 3, 2024

(54) REINFORCED SEMICONDUCTOR DEVICE PACKAGING AND ASSOCIATED SYSTEMS AND METHODS

(71) Applicant: Micron Technology, Inc., Boise, ID (US)

(72) Inventors: Suresh K. Upadhyayula, Meridian, ID (US); Yeow Chon Ong, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 34 days.

(21) Appl. No.: 17/552,217

(22) Filed: Dec. 15, 2021

(65) Prior Publication Data
US 2022/0208632 A1   Jun. 30, 2022

Related U.S. Application Data

(60) Provisional application No. 63/132,898, filed on Dec. 31, 2020.

(51) Int. Cl.
| | |
|---|---|
| H01L 23/31 | (2006.01) |
| H01L 21/56 | (2006.01) |
| H01L 23/00 | (2006.01) |
| H01L 23/29 | (2006.01) |
| H01L 25/065 | (2023.01) |

(52) U.S. Cl.
CPC .......... *H01L 23/3135* (2013.01); *H01L 21/56* (2013.01); *H01L 23/295* (2013.01); *H01L 23/562* (2013.01); *H01L 25/0657* (2013.01); *H01L 23/3121* (2013.01); *H01L 2225/0651* (2013.01); *H01L 2225/06562* (2013.01)

(58) Field of Classification Search
CPC ..................................................... H01L 23/562
See application file for complete search history.

(56) References Cited

U.S. PATENT DOCUMENTS

2012/0074599 A1*  3/2012  Kim ................ H01L 21/565
                                                  257/793

* cited by examiner

*Primary Examiner* — Yu-Hsi D Sun
(74) *Attorney, Agent, or Firm* — Perkins Coie LLP

(57) ABSTRACT

The subject application relates to reinforced semiconductor device packaging and associated systems and methods. The device generally includes a substrate and one or more integrated circuit dies electrically coupled to the substrate with wire bonds. The device includes an encapsulant enclosing the one or more dies and the wire bonds. The package can include a reinforcing layer positioned on one or more surfaces of the encapsulant, a reinforcing wire extending through the encapsulant, or entrained reinforcing fiber portions positioned throughout the encapsulant. The reinforcing layer can be textile woven from synthetic or natural fibers, such as aramid, carbon, or glass. The package can be formed by disposing a reinforcing textile layer in a mold, placing a die and substrate in the mold with a liquid encapsulant, and hardening the liquid encapsulant to adhere the reinforcing textile layer, the encapsulant, the die, and the substrate together.

15 Claims, 5 Drawing Sheets

REINFORCED SEMICONDUCTOR DEVICE PACKAGING AND ASSOCIATED SYSTEMS AND METHODS

CROSS-REFERENCE TO RELATED APPLICATION(S)

The present application claims priority to U.S. Provisional Patent Application No. 63/132,898, filed Dec. 31, 2020, the disclosure of which is incorporated herein by reference in its entirety.

TECHNICAL FIELD

The present disclosure is generally directed to semiconductor devices, and in several embodiments, more particularly to systems and methods of reinforcing packaging of a semiconductor device.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device.

The overall height of a microelectronic device package may be limited based on packaging specifications, intended application, and/or physical constraints of the circuit board or other element to which the semiconductor device is mounted. As die stacking is maximized within an individual package, the protective covering thickness is reduced accordingly, and the package structurally weakens. Such semiconductor devices may sustain damage during handling, packaging, transportation, assembly, use, etc., which can cause premature failure of the integrated circuit, the wire bonds, etc. Package strength is further reduced by minimizing the thickness of the substrate.

DETAILED DESCRIPTION

Figure 1:
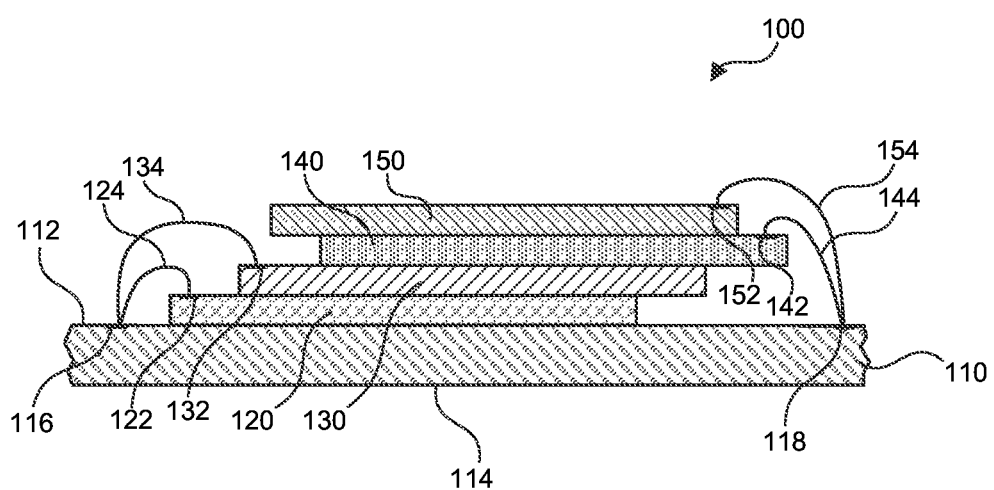
FIG. 1 is a cross-sectional view showing a semiconductor device configured in accordance with embodiments of the present technology, prior to application of an encapsulant.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. In some embodiments, an individual semiconductor device may be "packaged" and include a molding material, or encapsulant, encasing the components and electrical connections in the device. The encapsulant can be applied using a mold cavity or other suitable method.

Depending upon the context in which it is used, the term "substrate" can refer to a structure that supports electronic components (e.g., a die), such as a wafer-level substrate, a singulated die-level substrate, or another die for die-stacking applications. Suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes a semiconductor device having reinforced packaging configurations. The integrated circuit package can include the reinforcements such that the semiconductor device can withstand greater external forces without damage to the device. Conventional semiconductor device packaging uses an encapsulant without structural reinforcement. As die stack height is maximized, the thickness of the encapsulant and/or the substrate is accordingly minimized—weakening the structure of the package. Single dies integrated circuits are similarly structurally weakened. As such, handling, retail and shipping packaging, transportation, assembly, use, heat cycling, and/or other exposure to forces can cause stress, strain, and fatigue that overcomes the strength and/or flexibility of the package and leads to premature failure of the semiconductor device.

The present technology is generally directed to a bonded semiconductor device having a semiconductor die or die stack attached to a package substrate and covered with an encapsulant. The package substrate has a mounting surface to which the dies are attached. In one embodiment, each semiconductor die has an active side with bond pads facing away from the mounting surface of the substrate. The bond pads are generally positioned at an edge of the die, and the die is arranged on the mounting surface such that the bond pads on the edge of the die can be wire bonded to bond pads on the mounting surface of the substrate. In a stacked configuration, the dies may be positioned laterally offset or stepped to allow front side access to the bond pads of each die in the stack. After the dies are electrically coupled to the substrate, an encapsulant encases the die stack, wire bonds, and at least a portion of the exposed surface of the substrate. The encapsulation process can be performed in a mold cavity. Prior to encapsulation, a textile reinforcing layer can be disposed in the mold cavity to provide an at least partially embedded reinforcement (e.g., as the liquid mold compound at least partially, and in some cases fully, penetrates the weave of the textile reinforcing layer) on one or more of the outer surfaces of the encapsulant after it hardens. In some embodiments, the present technology permits reduced package size of the semiconductor device with higher mechanical strength and flexibility characteristics.

FIG. 1 shows a cross-sectional view of a semiconductor device 100 ("device 100"), prior to application of an encapsulant to the device 100. The device 100 can be a memory array such as a stack of NAND memory dies, which may further include one or more logic dies. The device 100 includes a silicon substrate 110 having a front side 112 (e.g., a die mounting surface) and a backside 114. The thickness of the substrate 110 can depend on packaging constraints, the number of dies in the device 100, etc. The device 100 has a first die 120 attached to the front side 112 of substrate 110. The first die 120 has bond pads 122 facing away from the front side 112 of the substrate 110 along an edge of the first die 120. The first die 120 can be positioned laterally away from contacts 116 on the front side 112 of the substrate 110 to allow access for wire bonds 124 configured to electrically couple the bond pads 122 of the first die 120 and the contacts 116 of the substrate 110. Although only a single bond pad 122 and a single contact 116 are shown in the cross-sectional view of FIG. 1, the device 100 typically has a large number of bond pads 122 and contacts 116.

The device 100 can have a second die 130 that is bonded in a laterally offset configuration to the first die 120, and have bond pads 132 facing away from the front side 112 of the substrate 110 along an edge of the second die 130. The bond pads 132 are configured to receive wire bonds 134 to electrically couple the second die 130 to the contacts 116 on the substrate 110. The device 100 can similarly include any number of additional dies, such as third and fourth dies 140 and 150. The third die 140 can be bonded in a laterally offset configuration to the first and second dies 120 and 130, and have bond pads 142 facing away from the front side 112 of the substrate 110 along an edge of the third die 140. The bond pads 142 are configured to receive wire bonds 144 and electrically couple the third die 140 to contacts 118 on the substrate 110. The fourth die 150 can be bonded in a laterally offset configuration to the first, second, and third dies 120, 130, and 140, and have bond pads 152 facing away from the front side 112 of the substrate 110 along an edge of the fourth die 150. The bond pads 152 are configured to receive wire bonds 154 and electrically couple the fourth die 150 to contacts 118 on the substrate 110.

Although four dies are shown in a stacked and laterally offset stepped configuration, in other embodiments, any number of dies packaged with the edge-notched substrate are within the scope of the present technology. Further, although one exemplary configuration of the device 100 is depicted in FIG. 1-2D, any suitable configuration of device is also within the scope of the present technology, e.g., multiple integrated circuits, devices, and/or die stacks on the same substrate, etc.

Figure 2A:
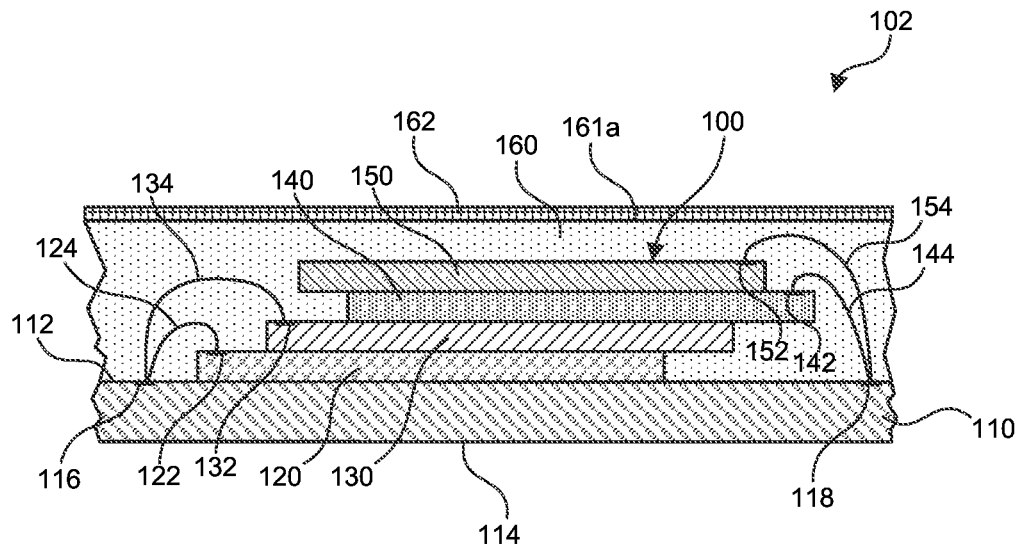
FIGS. 2A-2D are cross-sectional views showing a semiconductor package having the semiconductor device of FIG. 1, after application of the encapsulant and having various package reinforcement configurations.
Figure 2B:
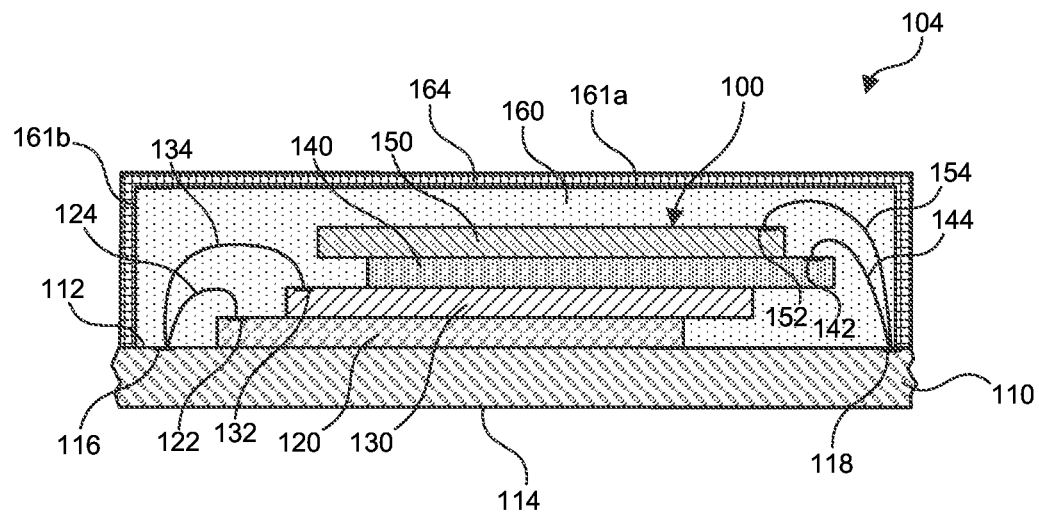
Figure 2C:
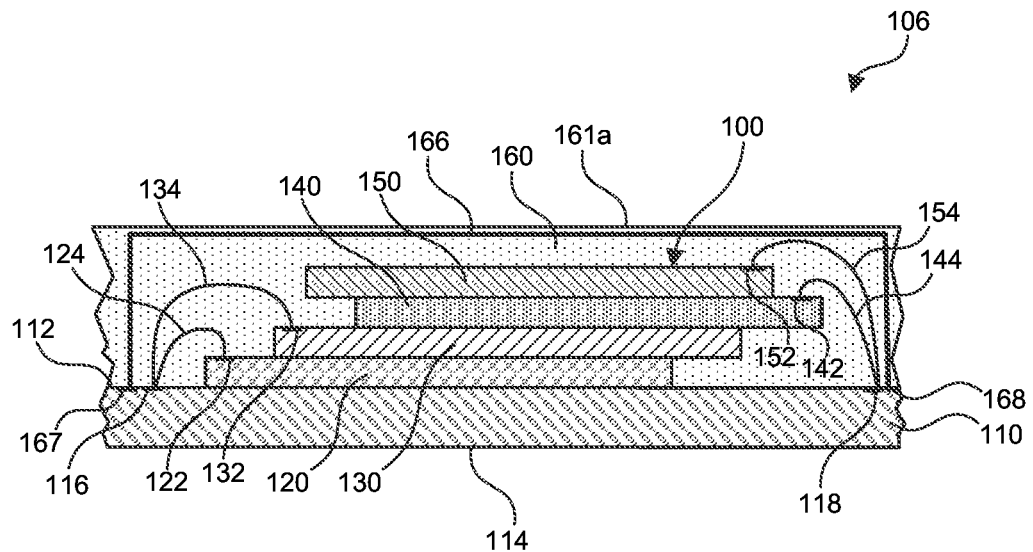
Figure 2D:
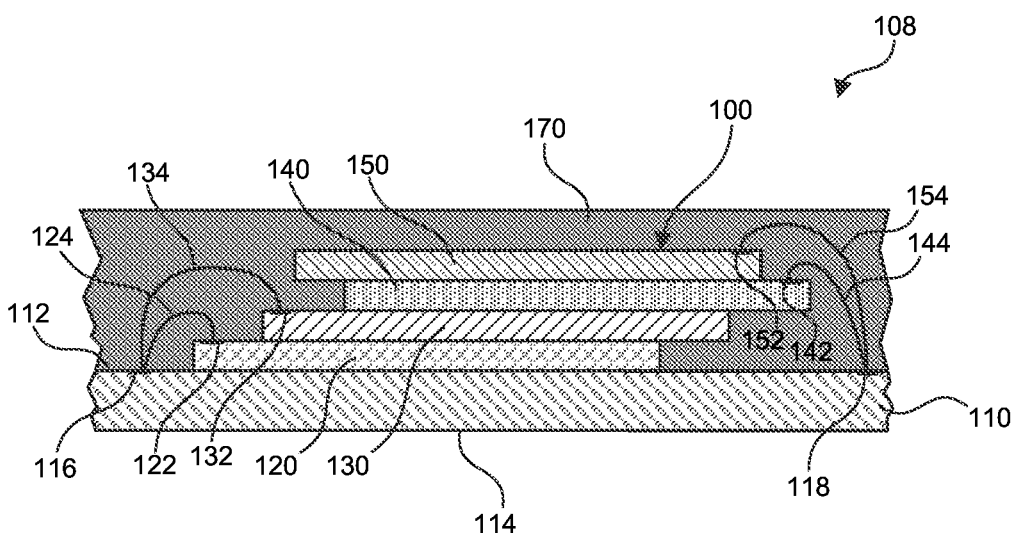

FIGS. 2A-2D are cross-sectional views showing the device 100 after application of an encapsulant and having various package reinforcement configurations. FIG. 2A shows a semiconductor package 102 ("package 102") having the device 100 and a packaging mold material 160 ("encapsulant 160") covering components of the device 100 after the dies 120, 130, 140, and 150 are bonded to the substrate 110 and electrically coupled to the substrate 110. The encapsulant 160 is applied by flowing liquid mold material over the mounted components of the device 100 within the boundaries of a mold chase (not shown). A mold chase is configured to constrain the outer shape of the package and hold the form until the liquid mold material solidifies. The package 102 has a reinforcing layer 162 applied to an upper surface 161a of the encapsulant 160. The reinforcing layer 162 can be inserted into the mold chase with the molding material to integrate the reinforcing layer 162 with the encapsulant 160. In other embodiments, the reinforcing layer 162 is coupled to a mold release film and applied to the mold chase before forming the package 102. The reinforcing layer 162 can be any suitable textile material, e.g., cloth, sheet, fabric, or the like. In some embodiments, the reinforcing layer 162 is a textile cloth woven with synthetic or natural fibers which having desired material properties of strength, elasticity, heat resistance, etc. Some examples of fibers suitable for use with the present technology include aramid (e.g., KEVLAR® and NOMEX®), carbon, and/or glass. Embodiments with cloth reinforcing layers can have a single fiber material or any suitable mixture of fiber materials. Further, any number of layers of cloth can form the reinforcing layer 162.

FIG. 2B shows a semiconductor package 104 ("package 104") having the device 100 and the encapsulant 160 covering components of the device 100 after the dies 120, 130, 140, and 150 are bonded and electrically coupled to the substrate 110. The package 104 has a reinforcing layer 164 applied to the upper surface 161a and to one or more lateral surfaces 161b of the encapsulant 160. The package 104 is generally similar to the package 102 except that the reinforcing layer 164 covers at least some of the lateral surfaces 161b of the encapsulant 160. In this regard, the material of the reinforcing layer 164 (e.g., cloth, sheet, plate, etc.) can be a single portion with folded areas or cuts at the corners of the encapsulant 160 to allow the material to adapt to the shape of the encapsulant 160. The reinforcing layer 164 can be inserted into the mold chase with the molding material to integrate the reinforcing layer 164 with the encapsulant 160. In other embodiments, the reinforcing layer 164 is coupled to a mold release film and applied to the mold chase before forming the package 104.

FIG. 2C shows a semiconductor package 106 ("package 106") having the device 100 and the encapsulant 160 covering components of the device 100 after the dies 120, 130, 140, and 150 are bonded and electrically coupled to the substrate 110. The package 106 has at least one reinforcing wire 166 extending through the encapsulant 160 and attached to the front side 112 of the substrate 110 at a first pad 167 and a second pad 168. The first and second pads 167 and 168 can be grounded such that the reinforcing wire 166 does not electrically alter the device 100. In some embodiments, the reinforcing wire 166 is bonded to the substrate 110 after bonding the dies 120, 130, 140, and 150 to the substrate 110. The reinforcing wire 166 can have any suitable material, such as copper, steel, aluminum, etc. In these embodiments, the reinforcing wire 166 can be thicker in diameter than the wire bonding of the dies of the device 100, and can be between about 20 μm and 100 μm. Although a single reinforcing wire 166 is shown in the cross-section of FIG. 2C, any number of reinforcing wires can be included in the encapsulant 160 of the package 106, and the wires can be positioned separated along the length of the wire, one or more of the wires can cross, or any combination thereof.

FIG. 2D shows a semiconductor package 108 ("package 108") having the device 100 and a fiber-reinforced encapsulant 170 covering components of the device 100 after the dies 120, 130, 140, and 150 are bonded and electrically coupled to the substrate 110. The fiber-reinforced encapsulant 170 includes molding material mixed with a plurality of entrained synthetic or natural fiber portions (e.g., aramid, carbon, glass, etc.) creating a slurry. The encapsulant 170 is formed using the mold chase and the fiber portions entrained within the slurry are randomly oriented when the material solidifies, increasing the mechanical strength of the encapsulant 170.

Although illustrated herein with reference to dies and die stacks that are wirebonded to a substrate, in other embodiments dies attached to substrates in a number of other manners may also benefit from textile reinforcing layers like those shown in the Figures and described above. For example, a die attached to a substrate with a direct chip attach (DCA) approach, in which the active surface of the die is attached by, e.g., solder interconnects directly to bond pads on the upper surface of the substrate, may also be similarly configured. Alternatively or additionally, semiconductor device packages in which a stack of dies are interconnected with through-substrate vias (TSVs) may also be similarly configured, mutatis mutandis.

The bond pads 122, 132, 142, and 152 and the contacts 116 and 118 can be copper pads and may be bonded using copper-to-copper bonding or other suitable techniques. Although not shown in the Figures, the packages 102, 104, 106, and 108 can be electrically coupled to other components with a BGA or other suitable interconnect configurations.

Figure 3:
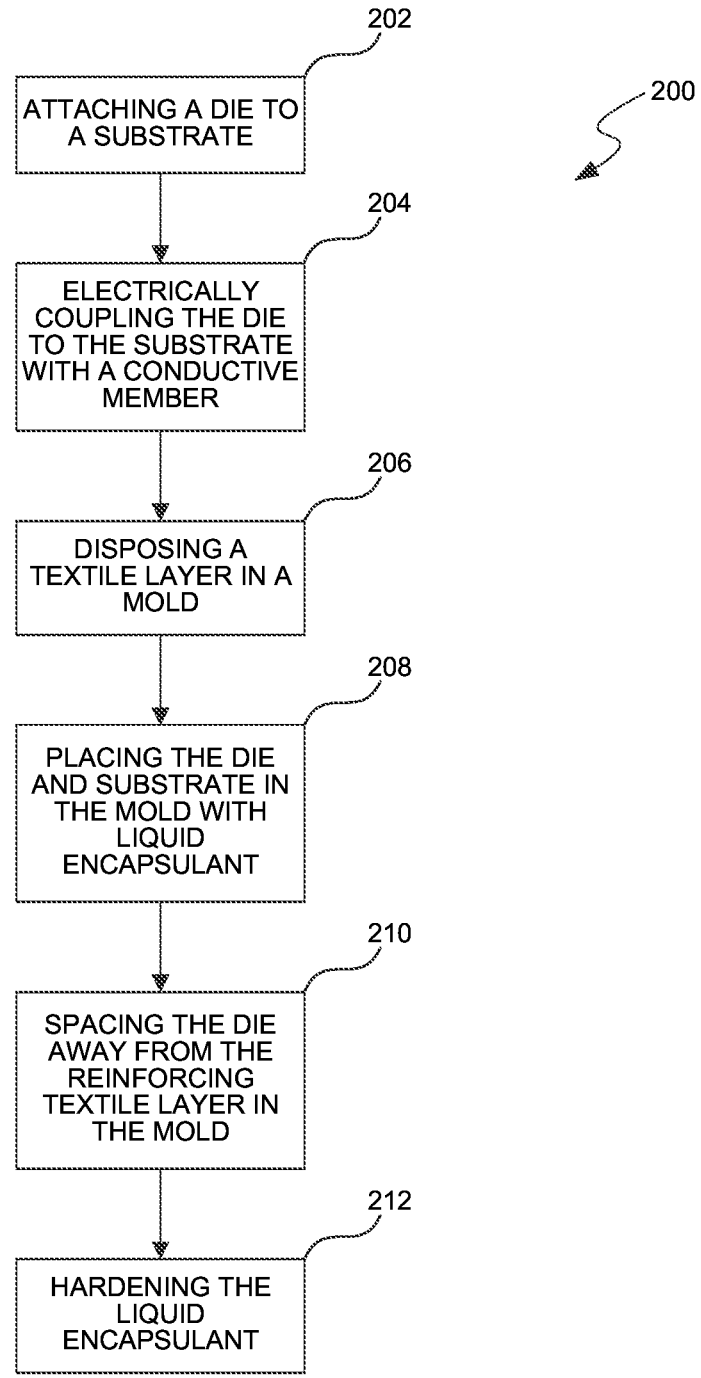
FIG. 3 is a flow chart illustrating a method of forming a semiconductor device package in accordance with an embodiment of the present technology.

FIG. 3 is a flow chart illustrating a method 200 of forming a semiconductor device package in accordance with an embodiment of the present technology. At block 202, the method includes attaching the die 120 to the front side 112 of a substrate 110. At block 204, the method includes electrically coupling the bond pad 122 of the die 120 to the substrate contact 116 on the front side 112 of the substrate 110 with a conductive member 124. At block 206, the method includes disposing the reinforcing layer 162 of a textile woven with synthetic or natural fibers in a mold. At block 208, the method includes placing the die 120 and substrate 110 in the mold with the liquid encapsulant 160. At block 210, the method includes spacing the die 120 away from the reinforcing textile layer 162 in the mold such that the liquid encapsulant 160 flows between the die 120 and the reinforcing textile layer 162. At block 212, the method includes hardening the liquid encapsulant 160 to adhere the reinforcing textile layer 162, the encapsulant 160, the die 120, and the substrate 110 together.

Figure 4:
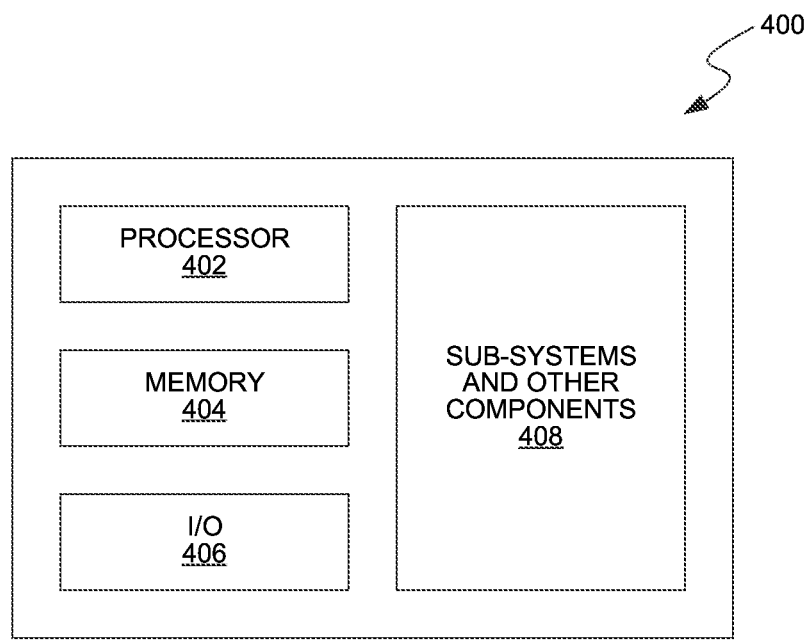
FIG. 4 is a schematic view of a system that includes a semiconductor device in accordance with embodiments of the present technology.

FIG. 4 is a block diagram illustrating a system that incorporates a semiconductor device in accordance with embodiments of the present technology. Any one of the semiconductor devices having the features described above with reference to FIGS. 1-3 can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 406, and/or other subsystems or components 408. The semiconductor assemblies, devices, and device packages described above with reference to FIGS. 1-3 can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 400 include lights, cameras, vehicles, etc. In these and other examples, the system 400 can be housed in a single unit or distributed over multiple interconnected units, e.g., through a communication network. The components of the system 400 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A semiconductor device, comprising:
   a substrate having a front side with a substrate contact;
   a die attached to the front side of the substrate;
   a wire bond electrically coupling a bond pad of the die to the substrate contact;
   an encapsulant enclosing the die and the wire bond; and a reinforcing textile layer extending over at least a portion of the encapsulant,
wherein the reinforcing textile layer extends across an upper surface of the encapsulant and a lateral surface of the encapsulant.

2. The semiconductor device of claim 1, wherein the reinforcing textile layer extends across an upper surface of the encapsulant.

3. The semiconductor device of claim 1, wherein the reinforcing textile layer is at least partially embedded in the portion of the encapsulant.

4. The semiconductor device of claim 1, wherein the reinforcing textile layer comprises a cloth woven from synthetic or natural fibers.

5. The semiconductor device of claim 4, wherein the fibers comprise aramid, carbon, glass, or a combination thereof.

6. The semiconductor device of claim 1, wherein:
the die is a first die, the bond pad is a first bond pad, and the wire bond is a first wire bond;
the semiconductor device further comprises a second die attached to the first die, the second die having a second bond pad electrically coupled to the substrate contact by a second wire bond; and
the second die and the second wire bond are enclosed within the encapsulant.

7. The semiconductor device of claim 1, further comprising a reinforcing wire coupled at a first end and at a second end to the front side of the substrate, the reinforcing wire extending over at least a portion of the die through the encapsulant.

8. The semiconductor device of claim 7, wherein the substrate further comprises a first grounded pad on the front side for coupling the first end of the reinforcing wire to the substrate, and a second grounded pad on the front side for coupling the second end of the reinforcing wire to the substrate.

9. The semiconductor device of claim 7, wherein the reinforcing wire comprises a plurality of wires extending through the encapsulant.

10. The semiconductor device of claim 9, wherein at least one of the plurality of wires crosses over another of the plurality of wires along a length of the encapsulant.

11. The semiconductor device of claim 7, wherein the reinforcing wire comprises copper, steel, aluminum, or a combination thereof.

12. A method of forming a semiconductor device package, comprising:
attaching a die to a front side of a substrate;
electrically coupling a bond pad of the die to a substrate contact on the front side of the substrate with a conductive member;
disposing a reinforcing textile layer in a mold;
placing the die and substrate in the mold with a liquid encapsulant; and
hardening the liquid encapsulant to adhere the reinforcing textile layer, the encapsulant, the die, and the substrate together, such that the reinforcing textile layer extends across an upper surface of the encapsulant and a lateral surface of the hardened liquid encapsulant.

13. The method of claim 12, further comprising spacing the die away from the reinforcing textile layer in the mold such that the liquid encapsulant flows between the die and the reinforcing textile layer prior to hardening the liquid encapsulant.

14. The method of claim 12, wherein the reinforcing textile layer comprises a cloth woven from synthetic or natural fibers.

15. The method of claim 14, wherein the fibers comprise aramid, carbon, or glass.

* * * * *